(12) United States Patent
Lee

(10) Patent No.: US 7,449,281 B2
(45) Date of Patent: Nov. 11, 2008

(54) PHOTOSENSITIVE RESIN COMPOSITION FOR BLACK MATRIX

(75) Inventor: Chun-Hsien Lee, Tainan (TW)

(73) Assignee: Chi-Mei Corporation, Tainan County (TW)

( * ) Notice: Subject to any disclaimer, the term of this patent is extended or adjusted under 35 U.S.C. 154(b) by 106 days.

(21) Appl. No.: 11/654,595

(22) Filed: Jan. 18, 2007

(65) Prior Publication Data
US 2007/0117876 A1 May 24, 2007

Related U.S. Application Data

(63) Continuation-in-part of application No. 10/846,566, filed on May 17, 2004, now abandoned.

(30) Foreign Application Priority Data
Dec. 1, 2004 (TW) .............................. 93101319 A

(51) Int. Cl.
*G03F 7/032* (2006.01)
(52) U.S. Cl. .................. 430/281.1; 430/285.1; 430/905
(58) Field of Classification Search .............. 430/281.1, 430/905, 285.1
See application file for complete search history.

(56) References Cited

FOREIGN PATENT DOCUMENTS

| JP | 8-278629 A | 10/1996 |
|---|---|---|
| JP | 2002-145999 A | 5/2002 |
| JP | 2003-29397 A | 1/2003 |
| JP | 2003-57431 A | 2/2003 |
| JP | 2004-233981 A | 8/2004 |
| JP | 2004-233993 A | 8/2004 |
| JP | 2004-233997 A | 8/2004 |
| JP | 2004-233998 A | 8/2004 |

OTHER PUBLICATIONS

Kitamura, Japanese Journal nmed Display, "Technology and Apparatus for Manufacturing Large-Sized Substrates of Color Filters of the Fifth Generation with the Slit Coating Process", Nov. 2002, pp. 36-41.
Japanese Journal named Electric Material, "Manufacturing of Substrates for Planar Displays with the Slit Coating Process", Jun. 2002, pp. 107-112.

*Primary Examiner*—Richard Schilling
(74) *Attorney, Agent, or Firm*—Birch, Stewart, Kolasch & Birch, LLP

(57) ABSTRACT

A photosensitive resin composition for a black matrix comprises (A) an alkali-soluble resin; (B) a photopolymerizable monomer; (C) a photoinitiator; (D) a solvent; and (E) a black pigment; wherein the alkali-soluble resin (A) comprises a functional group having a general formula (a-1); viscosity of said photosensitive resin composition for the black matrix is 0.5-4.0 cps at 25° C.; the solid content of said photosensitive resin composition is 5-17.5 wt. %; and said solvent (D) has a saturated vapor pressure below 4.5 mmHg at 20° C.; which presents no pinhole on the surface after low pressure drying, no line and cloud defect on the film, good inner uniformity of the coated film and high photosensitivity after pre-bake, high heat resistance for black matrix after post-bake, especially no poor coating on substrates of LCD by the slit coating.

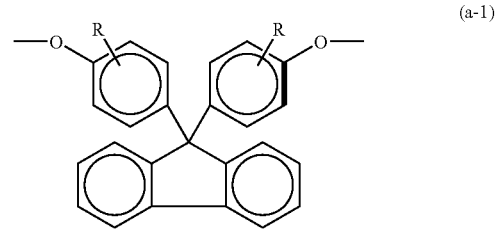

(a-1)

(Each of R is independently H, linear or branch alkyl of C1-C5, phenyl or halogen.)

4 Claims, 2 Drawing Sheets

PHOTOSENSITIVE RESIN COMPOSITION FOR BLACK MATRIX

This application is a Continuation-In-Part of Application No. 10/846,566 filed on May 17, 2004 now abandoned, the entire contents of which are hereby incorporated by reference and for which priority is claimed under 35 U.S.C. § 120.

BACKGROUND OF THE INVENTION

1. Field of the Invention

The present invention relates to a photosensitive resin composition for a black matrix. More specifically, it relates to a photosensitive resin composition, which can form a film having no pinhole on the surface after low pressure drying, no line or cloud defect on the film, satisfied inner uniformity and after pre-bake and high photosensitivity after pre-bake; and the black matrix having good heat resistance after post-bake, especially no poor coating on substrates of LCD by the slit coating.

2. Description of Related Art

Color filters of LCD are always desired to exhibit higher resolution and better qualities. In order to promote their contrast and related properties, light shielding films are generally formed between stripes and dots of the color filters. Generally, black matrix has been provided as light shielding films between red, green and blue pixels. Thus high quality of the contrast and hue of LCD can be obtained by shielding light to escape from gaps between the pixels.

The conventional black matrix is formed of chromium by vaporization deposition process. However, such process is complicated and the material is expensive. A solution for these problems is to apply photosensitive resin compositions to the black matrix through photolithographic processes. Japanese Patent Publication No. 08-278629 and 2003-29397 disclosed a fluorene-based alkali-soluble resin as the binder of the photosensitive resin composition, which was coated on the substrate to form a black matrix by employing the photolithographic processes. According to these disclosures, the photosensitive resin composition was first coated on the surface of a glass substrate by spin coating and was pre-baked to remove the solvent to form a pre-baked film. Thereafter, the film is exposed to UV light through a photo mask and cleaned or developed with weak alkaline solution to dissolve and remove the un-exposed portions of the film. The desired pattern of the black matrix is obtained after post-bake of the film.

In order to reduce costs for manufacturing LCD, technologies applied to large-sized substrates are continuously developed. The evolution of the sizes of the substrates for manufacturing LCD includes 320 mm×400 mm (first generation), 370 mm×470 mm (second generation), 550 mm×650 mm (third generation), and 680 mm×880 mm-730 mm×920 mm (fourth generation). In the future, as the fifth or further generation, the substrate having at least one side of longer than 1000 mm will be applied, such as, 960 mm×1100 mm, 1100 mm×1250 mm, 1100 mm×1300 mm, 1500 mm×1800 mm and 1800 mm×2000 mm, etc. The productivity can be higher when compared with that of the former generations.

For a substrate having a size of 550 mm×650 mm or lesser, the photosensitive resin composition is primarily coated thereon by the spin coating process. Though such process can easily control thickness of the films, it wastes more than 90% of the photosensitive resin composition as being spined away from the substrate. Moreover, edge beads of the photosensitive resin composition is usually formed on the peripheral regions of the substrate, which is removed with additional cleaning equipments and removing agent. So, the spin coating process costs much and is complicated in operation.

For the substrate of 730 mm×920 mm, the slit-spin coating process is applied to save the quantity of the photosensitive resin composition. In such process, the photosensitive resin composition is first coated on the substrate by slit coating, and then the substrate is spined so that the photosensitive resin material can be uniformly spread thereon. Accordingly, utilization ratio of the photosensitive resin composition can be promoted from less than 10% to about 20%. However, the problem of edge beads still exists.

As for the substrate having at least one side of longer than 1000 mm, only the slit coating process (that is, the spinless coating process) is applied, so that the photosensitive resin material can be more efficiently utilized. Related technologies are referred to "Display (Japanese Journal), November 2002, page 36, Technology and Apparatus for Manufacturing Large-Sized Substrates of Color Filters of the Fifth Generation with the Slit Coating Process" and "Electric Material (Japanese Journal), June 2002, page 107, Manufacturing of Substrates for Planar Displays with the Slit Coating Process". Using the slit coating process without the spinning step, utilization ratio of the photosensitive resin material is approximately 100% and the problem of edge beads no longer exists. Therefore the cost for materials, equipments, removing agent and the complexity of the coating process can be greatly lowered.

However, when the photosensitive resin composition comprising a fluorene-based alkali-soluble resin is used for the black matrix by the slit coating process, it usually causes some problems, such as pinholes on the surface of the film after low pressure drying, line and cloud defects on its surface and unsatisfactory inner uniformity of the thickness of the film after pre-bake, especially no poor coating on substrates of LCD by the slit coating. Apparently, these problems have adverse effects to the high quality needs of the later large-sized LCD displays, such LCD-TV and LCD monitors.

SUMMARY OF THE INVENTION

The object of the present invention is to provide a photosensitive resin composition for a black matrix, which presents no pinhole on the surface after low pressure drying, no line or cloud defects on the film, good inner uniformity and good photosensitivity, and high heat resistance after post-bake, especially no poor coating on substrates of LCD by the slit coating. The photosensitive resin composition of the present invention comprises an alkali-soluble resin (A); a photopolymerizable monomer (B); a photoinitiator (C); a solvent (D); and a black pigment (E); wherein said alkali-soluble resin (A) comprises a functional group having a general formula

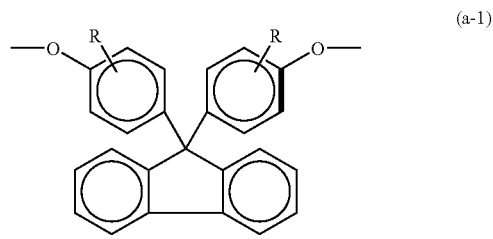

(a-1)

wherein each of R is independently H, linear or branch alkyl of C1-C5, phenyl or halogen; wherein the viscosity of said photosensitive resin composition for the black matrix is 0.5-

4.0 cps at 25° C. and the solid content of said photosensitive resin composition is 5-17.5 wt. %; wherein said solvent (D) has a saturated vapor pressure below 4.5 mmHg at 20° C.

BRIEF DESCRIPTION OF THE TABLES AND DRAWINGS

The preferred embodiments according to the present invention will be set forth in details thereinafter in illustration with the aid of the following tables and drawings, wherein:

Table 1 lists components of Examples and Comparative Examples; and

Table 2 lists evaluation results in Examples and Comparative Examples.

FIG. 2-1 shows no poor coating on the pre-backed film,

FIG. 2-2 shows poor coating on the pre-backed film, and

DETAILED DESCRIPTION OF THE INVENTION

Figure 1:
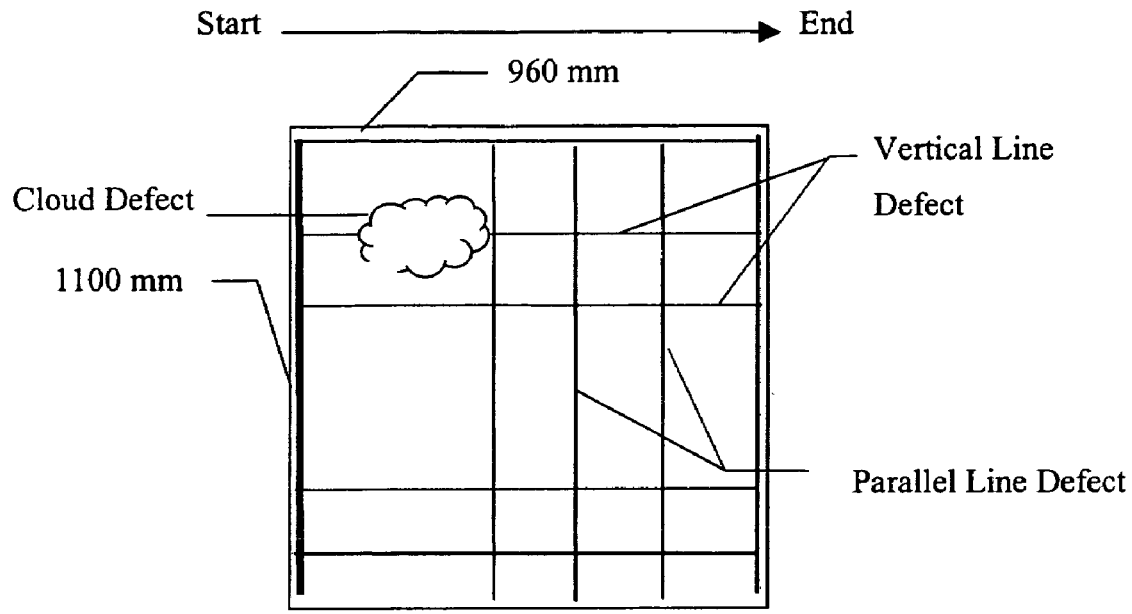
FIG. 1 shows the cloud defect on the pre-backed film.

Each component constituting the present invention will be described below.

(A) Alkali-Soluble Resin

The alkali-soluble resin (A) in the present invention comprises a functional group having a general formula (a-1), and is formed by polymerizing a compound comprising the functional group having the formula (a-1) and a copolymerizable compound;

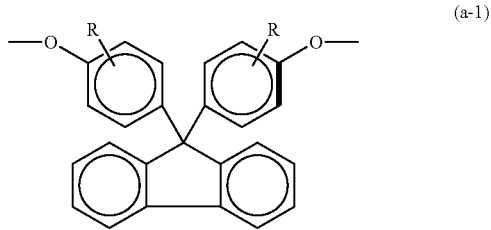

(a-1)

wherein each of R is independently H, linear or branch alkyl of C1-C5, phenyl or halogen.

Examples of the compound comprising the functional group having the formula (a-1) include epoxy or hydroxyl group containing bisphenolfluorene -based compounds which have a general formula (a-2) or (a-3), respectively, and are abbreviated as Compound (a-2) and Compound (a-3);

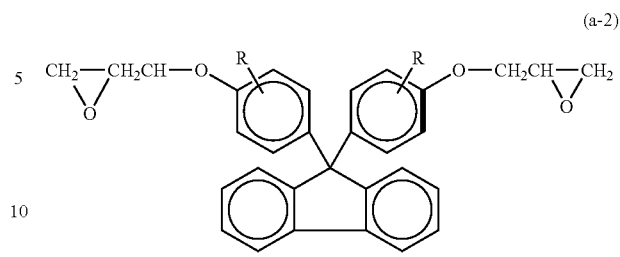

(a-2)

wherein R is defined as the above;

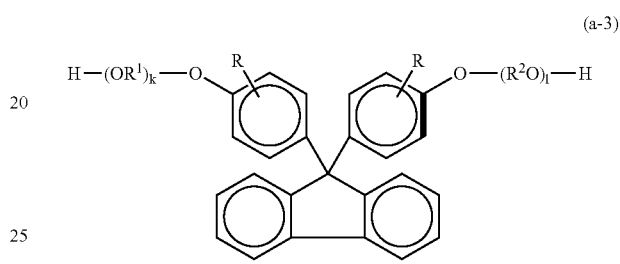

(a-3)

wherein R is defined as the above; $R^1$, $R^2$ are independently selected from alkylene or alicyclic of C1-C20; k, l are independently integers larger than 1.

Examples of the copolymerizable compound aforementioned include unsaturated monocarboxylic acids, such as acrylic acid, methacrylic acid, crotonic acid, α-chloroacrylic acid, ethacrylic acid and cinnamic acid etc.; dicarboxylic acids (or its anhydrides), such as maleic acid, succinic acid, itaconic acid, phthalic acid, tetrahydrophthalic acid, hexahydrophthalic acid, methyl tetrahydrophthalic acid, methyl hexahydrophthalic acid, methyl endo-methylene tetrahydro phthalic acid, chlorendic acid, glutaric acid, etc.; tricarboxylic acids (or its anhydrides), such as trimellitic acid, etc.; and tetracarboxylic acids (or its dianhydrides), such as pyromellitic acid, benzophenone tetracarboxylic acid, biphenyl tetracarboxylic acid, biphenylether tetracarboxylic acid, etc.

The method for producing the alkali-soluble resin (A) of the present invention is not limited, three of which are exemplified as follows:

Method I

Compound (a-2) and (meth)acrylic acid are first reacted to produce bisphenolfluroene-based epoxy (meth)acrylate (abbreviated as Compound(a-4));

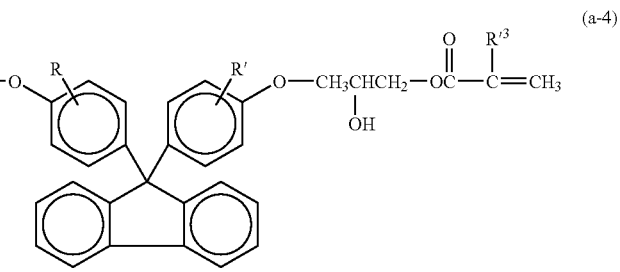

(a-4)

wherein R is defined as the above, $R^3$ is H or $CH_3$.

Then Compound (a-4) is reacted with "one kind of multi-carboxylic acids (or its anhydrides)" to obtain the alkali-soluble resin (A). For example, Compound (a-4) and dicarboxylic anhydride are heated and reacted in existence of an ester compound such as ethoxyethyl acetate or butoxyethyl acetate, and thus the alkali-soluble resin (A) having ethylenically unsaturated double bond and carboxyl group is obtained. The alkali-soluble resin (A) can be indicated by a general formula (A-1) (abbreviated as Resin (A-1)).

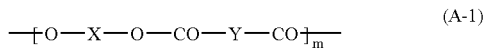
(A-1)

X can be indicated by a general formula (a-5) (abbreviated as Compound (a-5));

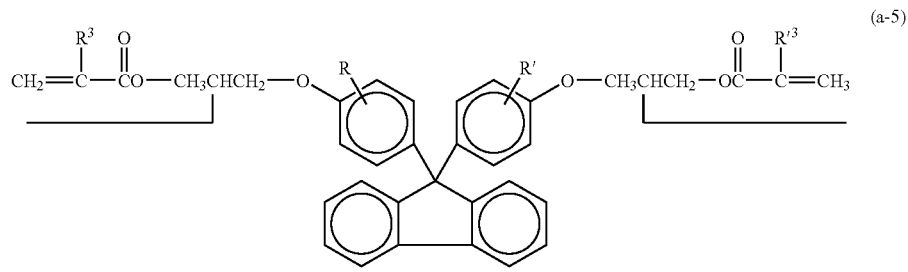
(a-5)

wherein R and $R^3$ are defined as the above;

Y is a residue of the dicarboxylic anhydride derived from the following compound of a general formula (a-6) (abbreviated as Compound (a-6));

(a-6)

wherein m is an integer larger than 1, preferably from 1 to 20.

"one kind of the multicarboxylic acid (or its anhydrides)" above-mentioned in Method I means only one kind of dicarboxylic acid or its anhydrides, tricarboxylic acid or its anhydrides and tetracarboxylic acid or its dianhydrides can be used during reactions.

Method II

Compound (a4) and a "mixture" of dicarboxylic anhydride and tetracarboxylic dianhydride are heated and reacted in existence of an ester compound such as ethoxyethyl acetate or butoxyethyl acetate, and thus the alkali-soluble resin (A) having ethylenically unsaturated double bond and carboxyl group is obtained. The alkali-soluble resin (A) produced by Method II can be indicated by a general formula (A-2) (abbreviated as Resin (A-2));

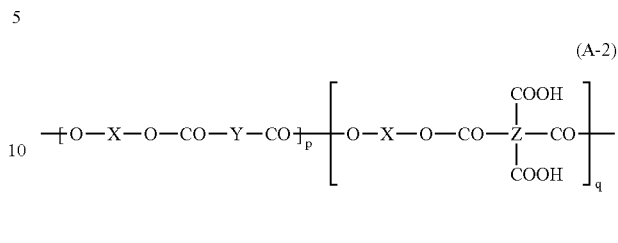
(A-2)

wherein X and Y are defined as the above;

Z is a residue of the tetracarboxylic dianhydride derived from the following compound of a general formula (a-7) (abbreviated as Compound (a-7));

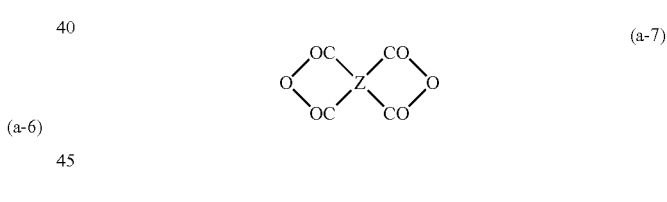
(a-7)

p and q are integers larger than 1, preferably 1-20.

The above "p" and "q" are degrees of polymerization, and the ratio p/q is preferably 1/99-90/10, more preferably 5/95-80/20.

The "mixture" aforementioned in Method II means the reaction is performed in existence of dicarboxylic anhydride and tetracarboxylic dianhydride.

Method III

Compound (a-4) and tetracarboxylic dianhydride are heated and reacted in existence of an ester compound such as ethoxyethyl acetate or butoxyethyl acetate. Then dicarboxylic anhydride is added into the solution for further reaction, and thus the alkali-soluble resin (A) having ethylenically unsaturated double bond and carboxyl group is obtained. The alkali-soluble resin (A) produced by Method III can be indicated by a general formula (A-3) (abbreviated as Resin (A-3));

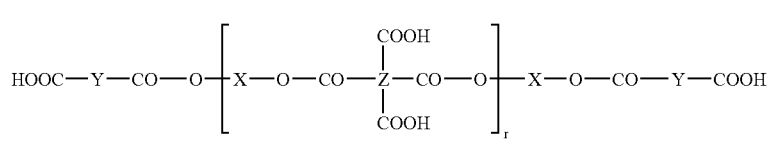

(A-3)

wherein X, Y and Z are defined as the above, r is an integer larger than 1, preferably 1-20.

In the above reaction of Methods I-III, Compound (a4) and multicarboxylic acid or its anhydrides are preferably reacted at 50-130° C., more preferably 70-120° C.

In the above reaction of Methods I-III, the equivalent (hereinafter abbreviated as Eq) of anhydrous group of multicarboxylic anhydride was preferably at 0.4-1.0 Eq based on 1 Eq of hydroxyl group of Compound (a4), more preferably at 0.75-1.0 Eq.

In the above reaction of Methods II and III, mole ratio of dicarboxylic anhydride to tetracarboxylic dianhydride is preferably 1/99-90/10, more preferably 5/95-80/20.

In the photosensitive resin composition of the present invention, as the alkali-soluble resin (A) comprises the functional group of formula (a-1), the pre-baked film can perform better photosensitivity, and the black matrix have higher heat resistance after post-bake.

(B) Photopolymerizable Monomer Amount of the photopolymerizable monomer (B) used in the present invention is generally 5-220 parts by weight, preferably 10-160 parts by weight, more preferably 15-120 parts by weight, based on 100 parts by weight of the alkali-soluble resin (A).

The photopolymerizable monomer (B) in the present invention is a monomer having at least one ethylenically unsaturated double bond.

Examples of the photopolymerizable monomer (B) having one ethylenically unsaturated double bond are as follows: acrylamide, (meth)acryloylmorpholine, 7-amino-3,7-dimethyloctyl (meth)acrylate, isobutoxymethyl (meth)acrylamide, isobomyloxyethyl (meth)acrylate, isobornyl (meth)acrylate, 2-ethylhexyl (meth)acrylate, ethyl diethylene glycol (meth)acrylate, t-octyl (meth)acrylamide, diacetone (meth)acrylamide, dimethylaminoethyl (meth)acrylate, dodecyl (meth)acrylate, dicyclopentenyloxyethyl (meth)acrylate, dicyclopentenyl (meth)acrylate, N,N-dimethyl (meth)acrylamide, tetrachlorophenyl (meth)acrylate, 2-tetrachlorophenoxyethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinylcaprolactam, N-vinylpyrrolidinone, phenoxyethyl (meth)acrylate, pentachlorophenyl (meth)acrylate, pentabromophenyl (meth)acrylate, polyethylene glycol mono(meth)acrylate, polypropylene glycol mono(meth)acrylate and bornyl (meth)acrylate, and the like.

Examples of the photopolymerizable monomer (B) having two or more ethylenically unsaturated double bond are as follows: ethylene glycol di(meth)acrylate, dicyclopentenyl di(meth)acrylate, triethylene glycol diacrylate, tetraethylene glycol di(meth)acrylate, tris(2-hydroxyethyl) isocyanate di(meth)acrylate, tris(2-hydroxyethyl) isocyanante tri(meth)acrylate, caprolactone-modified tris(2-hydroxyethyl) isocyanante tri(meth)acrylate, trimethylolpropyl tri(meth)acrylate, ethyleneoxide (hereinafter abbreviated as EO) modified trimethylolpropyl tri(meth)acrylate, propyleneoxide(hereinafter abbreviated as PO) modified trimethylolpropyl tri(meth) acrylate, tripropylene glycol di(meth)acrylate, neopentyl glycol di(meth)acrylate, 1,4-butanediol di(meth)acrylate, 1,6-hexadiol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol triacrylate, EO-modified bisphenol F di(meth)acrylate, phenol novolac polyglycidyl ether (meth) acrylate, and the like.

Among these, trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate and PO-modified glycerol triacrylate are preferred.

(C) Photoinitiator

The amount of the photoinitiator (C) used in the present invention is generally 2-120 parts by weight, preferably 5-70 parts by weight, more preferably 10-60 parts by weight, based on 100 parts by weight of the photopolymerizable monomer (B).

The photoinitiator (C) aforementioned can be acyl oxime, acetophenone or biimidazole.

Examples of acyl oxime include ethanone,1-[9-ethyl-6-(2-methylbenzoyl)-9H-carbazole-3-yl]-,1-(O-acetyl oxime) (CGI-242, manufactured by Ciba Specialty Chemicals, having a general structural formula (c-1)), 1-(4-phenyl-thio-phenyl)-octane-1,2-dion 2-oxime-O-benzoate (CGI- 124, manufactured by Ciba Specialty Chemicals, having a general structural formula (c-2)), ethanone,1-[9-ethyl-6-(2-chloro-4-benzyl-thio-benzoyl)-9H-carbazole-3-yl]-,1-(O-acetyl oxime) (manufactured by Asahi Denka Co., Ltd., having a general structural formula (c-3)).

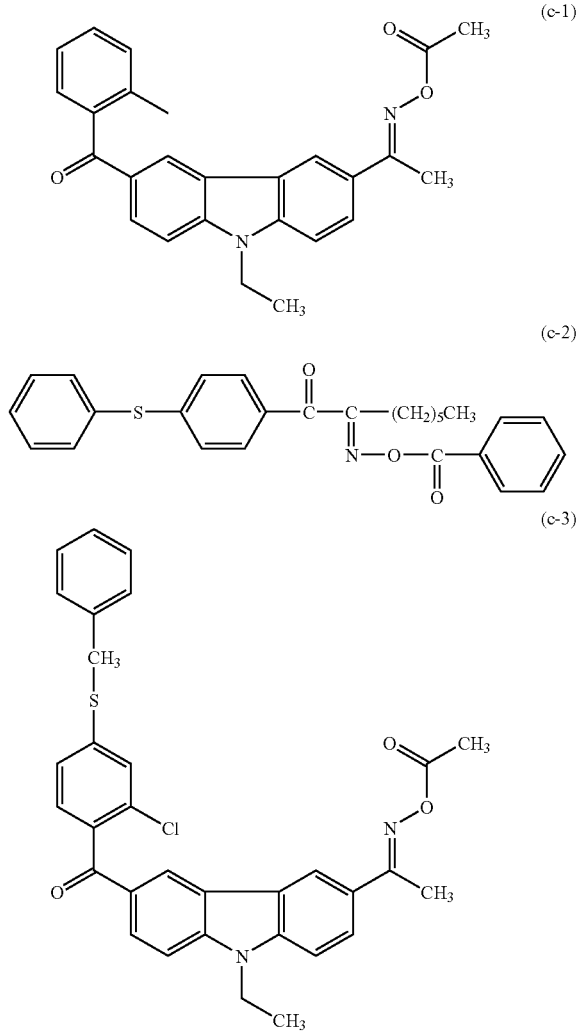

Examples of the acetophenone series compounds include p-dimethylaminoacetophenone, α,α'-dimethoxyazoxyacetophenone, 2,2'-dimethyl-2-phenylacetophenone, p-methoxy-acetophenone, 2-methyl-[4-(methylthio)phenol, 2-morpholino-1-propanone, 2-benzyl-2-N, N-dimethyl amino-1-(4-morpholinophenyl)-1-butanone.

Examples of the biimidazole series compounds include
2,2'-bis(o-chlorophenyl)-4,4',5,5'-tetraphenylbiimidazole,
2,2'-bis(o-fluorophenyl)-4,4',5,5'-tetraphenylbiimidazole,
2,2'-bis(o-methylphenyl)-4,4',5,5'-tetraphenylbiimidazole
2,2'-bis(o-methoxyphenyl)-4,4',5,5'-tetraphenylbiimidazole,
2,2'-bis(p-methoxyphenyl)-4,4',5,5'-tetraphenylbiimidazole
,
2,2'-bis(2,2',4,4'-tetramethoxyphenyl)4,4'5,5'-tetraphenylbiimidazole,
2,2'-bis(2-chlorophenyl)4,4'5,5'-tetraphenylbiimidazole,
2,2'-bis(2,4-dichlorophenyl)-4,4'5,5'-tetraphenylbiimidazole and the like.

Among these, ethanone, 1-[9-ethyl-6-(2-methylbenzoyl)-9H-carbazole-3-yl]-,1-(O-acetyl oxime), 2-methyl-1-(4-methylthiophenyl)-2-morpholino propane-1-on, 2-benzyl-2-N, N-dimethylamino-1-(4-morpholinophenyl)-1-butanone, 2,2'-bis(2,4-dichlorophenyl)-4,4'5,5'-tetraphenylbiimidazole are preferred. The photoinitiator can be used singly or combinedly.

In the photosensitive resin composition for a black matrix of the present invention, the photoinitiators of the benzophenone series compounds can be further added, such as thioxanthone, 2,4-diethylthioxanthone, thioxanthone-4-sulfone, benzophenone, 4,4'-bis(dimethylamino)benzophenone, 4,4'-bis (diethylamino)benzophenone and the like.

Examples of the other photoinitiators that can be further added in the present invention include α-diketone series compounds, such as benzil, acetyl and the like; acyloin series compounds, such as benzoin and the like; acyloin ether series compounds, such as benzoin methyl ether, benzoin ethyl ether, benzoin isopropyl ether and the like; acylphosphineoxide series compounds, such as 2,4,6-trimethylbenzoyl diphenylphosphineoxide, bis-(2,6-dimethoxy-benzoyl)-2,4,4-trimethyl benzylphosphineoxide and the like; quinone series compounds, such as anthraquinone, 1,4-naphthoquinone and the like; halide compounds, such as phenacyl chloride, tribromomethyl phenylsulfone, tris(trichloromethyl)-s-triazine and the like; peroxide, such as di-tert-butyl peroxide and the like. Among these, benzophenone series compounds, such as 4,4'-bis(diethylamino) benzophenone is preferred.

(D) Solvent

The photosensitive composition for a black matrix of the present invention comprises the alkali-soluble resin (A), the photopolymerizable monomer (B), the photoinitiator (C), the solvent (D) and the black pigment (E) as essential components and may optionally contain the other additive components as required.

Said solvent (D) can be any solvent as long as they can dissolve the alkali-soluble resin (A), the photopolymerizable monomer (B) and the photoinitiator (C), and they are inert to the other components and have appropriate volatility.

The amount of solvent (D) used for preparing the photosensitive resin composition for the black matrix in the present invention is generally 1,500-6,000 parts by weight, preferably 1,800-5,500 parts by weight, more preferably 2,000-5,000 parts by weight, based on 100 parts by weight of said alkali-soluble resin (A).

The solvent (D) used in the present invention is desired to easily dissolve other organic components, and generally has a saturated vapor pressure below 4.5 mmHg at 20° C., preferably below 4.0 mmHg, more preferably below 3.8 mmHg.

If the solvent (D) has a saturated vapor pressure higher than 4.5 mmHg at 20° C., the photosensitive resin composition will present pinholes on the surface after low pressure drying, and the inner uniformity of the thickness of the film is unsatisfactory after pre-bake.

Examples of the solvent (D) are as follows: (poly) alkylene glycol monoalkyl ether, such as ethylene glycol monoethyl ether, ethylene glycol monopropyl ether, diethylene glycol monomethyl ether, diethylene glycol monoethyl ether, diethylene glycol n-propyl ether, diethylene glycol n-butyl ether, propylene glycol monoethyl ether, dipropylene glycol monomethyl ether, dipropylene glycol monoethyl ether, dipropylene glycol n-propyl ether, dipropylene glycol n-butyl ether; (poly) alkylene glycol monoalkyl ether acetate, such as ethylene glycol monomethyl ether acetate, ethylene glycol monoethyl ether acetate, propylene glycol monomethyl ether acetate, propylene glycol monoethyl ether acetate and the like; ether, such as diethylene glycol dimethyl ether, diethylene glycol methyl ethyl ether, diethylene glycol diethyl ether; alkyl lactate, such as methyl 2-hydroxypropionate and ethyl 2-hydroxypropionate; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate and the like.

The solvents can be used alone or in admixture of two or more.

Among these solvents, diethylene glycol dimethyl ether, propylene glycol monomethyl ether acetate and ethyl 3-ethoxy propionate are preferred.

(E) Black Pigment

The amount of pigment (E) used for preparing the photosensitive resin composition for a black matrix in the present invention is generally 60-300 parts by weight, based on 100 parts by weight of the alkali-soluble resin (A).

The black pigment (E) used in the present invention is desired to have good properties including heat resistance, light resistance and chemical resistance. Examples of the black pigment include organic black pigment, such as perylene black, cyanine black, aniline black and the like; an black-like admixture of two or more pigments selected from red, blue, green, purple, yellow, cyanine, magenta and the like; inorganic black pigment, such as carbon black, chromium oxide, ferric oxide, titanium black, graphite. The pigments can be used alone or in admixture of two or more.

The pigment (E) in the present invention can be used in combination with a dispersant as desired. The dispersant is, for example, a cationic, anionic, nonionic or amphoteric surfactant, or a silicone-based or fluorine-based surfactant in terms of composition.

Examples of the surfactant include polyoxyethylene alkyl ethers, such as polyoxyethylene lauryl ether, polyoxyethylene stearyl ether, polyoxyethylene oleyl ether, and the like; polyoxyethylene aryl ethers, such as polyoxyethylene octyl phenyl ether, polyoxyethylene nonyl phenyl ether; polyethylene glycol dialkyl esters, such as polyethylene glycol dilaurate, polyethylene glycol distearate, and the like; sorbitan fatty acid esters; fatty acid modified polyesters; tertiary amine modified polyurethans. The following examples of surfactants can be used,Such as: KP (manufactured by Shin-Etsu Chemical Industry Co., Ltd.), Polyflow (manufactured by Kyoei-Sha Yushi Kagaku Kogyo Co., Ltd.), Megafac (manufactured by Dainippon Chemicals and Lnk Co., Ltd.), Florard (manufactured by Surnitomo 3M Co., Ltd.), and Asahi Guard, Serflon (manufactured by Asahi Glass Co., Ltd.), and the like. The surfactants can be used alone or in admixture of two or more.

To improve coatability of the present invention, the photosensitive resin composition can be used in combination with a surfactant. The amount of the surfactants used in the present invention is generally 0-6 parts by weight, preferably 0-4 parts by weight, more preferably 0-3 parts by weight, based on 100 parts by weight of said alkali-soluble resin (A). Examples of the surfactants are the same as the surfactants used in the pigment aforementioned.

The photosensitive composition of the present invention can contain other additives, such as fillers, polymers other than the alkali-soluble resin (A), adhesion agents, antioxidants, UV absorbents, anti-coagulants, cross-linking agent, diluent and the like. The amount of the additives except cross-linking agent and diluent is generally 0-10 parts by weight, preferably 0-6 parts by weight, more preferably 0-3 parts by weight, based on 100 parts by weight of the alkali-soluble resin (A). The amount of the cross-linking agent or diluent is generally 0-500 parts by weight, preferably 0-400 parts by weight, more preferably 0-300 parts by weight, based on 100 parts by weight of said alkali-soluble resin (A).

Examples of these additives can be exemplified as follows: fillers, such as glass, alumina; polymers other than the alkali-soluble resin (A), such as polyvinyl alcohol, polyacrylic acid, polyethylene glycol monoalkyl ether, polyfluoro alkylacrylate and the like; adhesion agents, such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxy-silane, 3-aminopropyltriethoxysilane, 3-glycidyloxy propyltrimethoxysilane, 3-glycidyloxypropylmethyldimethoxysilane, 2-(3,4-epoxycyclohexyl)ethyltrimethoxy-silane, 3-chloropropylmethyl dimethoxysilane, 3-chloropropyltrimethoxysilane, 3-methacryloxypropyl trimethoxysilane, 3-mercaptopropyltrimethoxysilane and the like; antioxidants, such as 2,2-thiobis (4-methyl-6-t-butylphenol), 2,6-di-t-butylphenol and the like; UV absorbents, such as 2-(3-t-butyl-5-methyl-2-hydroxyphenyl)-5-chlorobenzotriazole, alkoxybenzophenone and the like; and anti-coagulant, such as sodium polyacrylate. The cross-linking agent can be epoxy compounds or resins, such as 1031S, 157S-70 (manufactured by Japan Epoxy Resins Co., Ltd.). The diluent can be RE801, RE802 (manufactured by Teikoku Printing Inks Mfg. Co., Ltd.).

In the present invention, viscosity of the photosensitive resin composition for a black matrix is generally 0.5-4.0 cps at 25° C., preferably 0.7-3.5 cps, more preferably 0.9-3.0 cps.

In order to achieve effects of the present invention, i.e., no line or cloud defect and good inner uniformity for coating after pre-bake, high photosensitivity, and high heat resistance for black matrix after post-bake, the photosensitive resin composition is desired to meet the following conditions: (1) the alkali-soluble resin (A) comprises a functional group having the formula (a-1); and (2) viscosity of the photosensitive resin composition is 0.5-4.0 cps at 25° C.

Viscosity of the photosensitive resin composition for the black matrix can be adjusted in accordance with types or amounts of the alkali-soluble resin (A), the solvent (D) or the additives.

The solid content of the photosensitive resin composition is generally 5-17.5 wt. %, preferably 7-17.5 wt. %, and more preferably 9-17.5 wt. %, based on the photosensitive resin composition.

In order to achieve the present invention, i.e., no line or cloud defect and good inner uniformity, the following conditions are desired: (1) viscosity of the photosensitive resin composition for the black matrix is 0.5-4.0 cps at 25° C.; and (2) the solid content of the photosensitive resin composition is 5-17.5 wt. %.

Especially, if the solid content of the photosensitive resin composition is more than 17.5 wt. %, the poor coating occurs on substrates of LCD by the slit coating.

The solid content of the photosensitive resin composition can be adjusted with types or amounts of the solvent (D), the alkali-soluble resin (A), the photopolymerizable monomer (B) or the additives.

The photosensitive resin composition for a black matrix according to the present invention is formed by blending the above-mentioned components (A)-(E) in a mixer to obtain a solution, and the additives such as surfactant, adhesion agent or cross-linking agent can be added, optionally.

The photosensitive resin composition for a black matrix can be coated on a substrate by slit coating process. Then it is dried at low pressure to remove most of the solvent, and pre-baked to evaporate the residual solvent so as to form a coating film.

Operation conditions for low pressure drying and pre-bake are dependent on sorts and dosages of the components of the photosensitive resin composition. In general, low pressure drying is carried out at 0-200 mmHg for 1-10 seconds, and pre-bake is carried out at 70-110° C. for 1-15 minutes. Then, the coating film was exposed to UV light through a specific photo mask, and developed in a developer solution at 23±2° C. for 15 seconds-5 minutes to dissolve and remove the un-exposed portions of the coating film, so as to give a desired pattern. The UV light used for this purpose can be g line, h line, i line and the like. The UV lamp is (ultra) high-pressure mercury lamp and metal halide lamp.

The substrate used to form the black matrix can be made from bare glass, soda glass, pyres glass, silica glass, or these glass coated with a transparent conductive film, or transparent electrode substrate used in solid state image pick up device.

The alkali developer is preferably an aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diazabicyclo-(5,4,0)-7-undecene and the like. The concentration of alkali developer is 0.001 wt %-10 wt %, preferably 0.005 wt %-5 wt %, more preferably 0.01 wt %-1 wt %.

After developed with the developer solution, the resulted pattern is sufficiently washed with water and dried with compressed air or compressed nitrogen.

Finally, it is post-baked with a heating device such as a hot plate at 150-250° C. for 5-60 minutes or an oven at 150-250° C. for 15-90 minutes. Through the above-mentioned procedures, the black matrix for LCD of the present invention is obtained.

EXAMPLES AND COMPARATIVE EXAMPLES

The present invention will be further illustrated by the following examples.

[Synthesis of the Alkali-Soluble Resin (A)]

Synthesis Example a

A 500 ml separable flask equipped with a stirrer, a heater, a condenser, and a thermometer is purged with air. Then a mixture comprising 100 parts by weight of bisphenolfluorene-based epoxy compound having formula (a-2) and epoxy Eq. 230, 0.3 part by weight of tetramethyl ammonium chloride, 0.1 part by weight of 2,6-di-t-butyl-p-cresol, 30 parts by weight of acrylic acid and 130 parts by weight of propylene glycol monomethyl ether acetate, was charged to the flask. These components were charged continuously in a rate of 25 parts by weight/minute. The temperature for reaction was maintained at 100-110° C., and the residence time was 15 hours. After complete reaction, a light yellow transparent solution, bisphenolfluorene-based epoxy(meth)acrylate (i.e., Compound (a-4)), with 50 wt. % of solid content was obtained.

Then, an admixture comprising 100 parts by weight of Compound (a-4) obtained as the above, 25 parts by weight of propylene glycol monomethyl ether acetate, 13 parts by weight of benzophenone tetracarboxylic dianhydride, and 6 parts by weight of 1,2,3,6-tetrahydro phthalic anhydrie was added into a 300 ml separable flask. The temperature for polymerization was maintained at 110-115° C., and the residence time was 2 hours. A yellow transparent solution, i.e., the alkali-soluble resin of formula (A-2), was obtained. The acid value of the resin was 98.0 mg KOH/g, weight average molecular weight was 4100, and p/q was 5/5.

After complete polymerization, the polymer solution was moved out from the separable flask, and the alkali-soluble resin (a) could be obtained while evaporating the solvent.

Synthesis Example b 100 parts by weight of Compound (a-4) obtained in Synthesis Example a, 25 parts by weight of propylene glycol monomethyl ether acetate, and 13 parts by weight of benzophenone tetracarboxylic dianhydride were charged in a 300 ml separable flask. The temperature for reacton was 90-95° C., and the residence time was 2 hours. Disappearance of anhydrous group was confirmed with IR spectrum analysis. Then, 6 parts by weight of 1,2,3,6tetrahydro phthalic anhydrie was added into the reaction solution. Temperature for reaction was 90-95° C., and the residence time was 4 hours. A light yellow transparent solution, i.e., the alkali-soluble resin of formula (A-3), was obtained. The acid value of the resin was 99.0 mg KOH/g, and weight average molecular weight was 3900.

After complete polymerization, the polymer solution was moved out from the separable flask, and the alkah-soluble resin (b) could be obtained while evaporating the solvent.

Synthesis Example c

A 300 ml four-necked conical flask equipped with a stirrer, a heater, a condenser, and a thermometer is purged with nitrogen. Then a mixture comprising 25 parts by weight of methacrylic acid monomer, 50 parts by weight of benzyl methacrylate monomer, 25 parts by weight of methyl acrylate monomer, 2.4 parts by weight of 2,2'-azobis-2-methyl butyronitrile as polymerization initiator, and 240 parts by weight of propylene glycol monomethyl ether acetate was charged in the flask in one shot. Temperature for polymerization was 100° C., and the residence time was 6 hours.

After complete polymerization, the polymer solution was moved out from the flask, and the alkali-soluble resin (c) could be obtained while evaporating the solvent.

[Preparation of the Photosensitive Resin Composition for Black Matrix]

Example 1

100 parts by weight (based on dry matter) of the alkali-soluble resin (a) obtained in the above Synthesis Example a, 60 parts by weight of dipentaerythritol hexaacrylate (hereinafter abbreviated as B-1), 20 parts by weight of ethanone,1-[9-ethyl-6-(2-methylbenzoyl)-9H-carbazole-3-yl]-,1-(O-acetyl oxime) (hereinafter abbreviated as C-1), 5 parts by weight of 2-methyl-1-(4-methylthio phenyl)-2-morpholino propane-1-on (hereinafter abbreviated as C-2), 150 parts by weight of the black pigment C.I. 7 (hereinafter abbreviated as E-1), 1 part by weight of 3-methacryloxypropyltrimethoxysilane as adhesion agent, 15 parts by weight of 1031S (manufactured by Japan Epoxy Resins Co., Ltd.) as cross-linking agent, 100 parts by weight of RE801 (manufactured by Teikoku Printing Inks Mfg. Co., Ltd.) as diluent were added into 3000 parts by weight of a sovent of propylene glycol monomethyl ether acetate (hereinafter abbreviated as D-1). Then, the mixture was shaked for blending and dissolution, and the photosensitive resin composition for the black matrix was obtained.

The photosensitive resin composition was evaluated with the following analysis, and the results were listed in Table 2.

Examples 2-6

The procedure of Example 1 is repeated, except that the kinds and dosages of the alkali-soluble resin (A), photopolymerizable monomer (B), the photoinitiator (C), the solvent (D), the black pigment (E) and the additives were changed as Table 1. The evaluation results were shown in Table 2.

Comparative Examples 1-6

The procedure of Example 1 is repeated, except that the kinds and dosages of the alkali-soluble resin (A), photopolymerizable monomer (B), the photoinitiator (C), the solvent (D), the black pigment (E) and the additives were changed as in Table 1. The evaluation results were shown in Table 2.

Comparative Examples 7-8

The procedure of Example 1 is repeated, except that the kinds and dosages of the alkali-soluble resin (A), photopolymerizable monomer (B), the photoinitiator (C), the solvent (D), the black pigment (E) and the additives were changed as in Table 1. The solid content of the photosensitive resin composition is 19.1 wt % and 21.0 wt %, respectively. The evaluation results were shown in Table 2.

Evaluation Method

1. Viscosity (Unit: cps)

The viscosity of the resin composition was measured at 25° C., with an E-type rotation viscometer (Accretech, Tokyo Seimitsu) at 6 rpm.

2. Solid Content (Unit: %)

5 c.c. of the photosensitive resin composition for the black matrix was contained in an aluminum disk, which was then dried on a heater at 220° C. for 30 minutes. The solid content was determined according to the following equation:

$$\frac{W_2 - W_{A1}}{W_1 - W_{A1}} \times 100 \text{ wt \%}$$

$W_{A1}$: net weight of the aluminum disk
$W_1$: weight of the aluminum disk before drying
$W_2$: weight of the aluminum disk after drying 3. Saturated Vapor Pressure (Unit: mmHg)

The saturated vapor pressure was determined at 20° C., according to evapotranspiration method (gas flux method).

4. Pinhole

The photosensitive resin composition was coated on a 1100 mm×960 mm glass substrate by the slit-coating process, and then dried with the low pressure drying process at 100 mmHg for 5 seconds. The pinholes on the coating film were observed with bare eyes under white light.

○: no pinhole
Δ: a few pinholes
X: a lot of pinholes

5. Line Defect

The photosensitive resin composition was coated on a 1100 mm×960 mm glass substrate by the slit-coating process, and then dried with the low pressure drying process at 100 mmHg for 5 seconds. Then the coating film was pre-baked at 85° C. for 5 minutes to form a pre-baked film. The line defect was observed with bare eyes under a sodium lamp. The line defect including horizontal and vertical line defects are shown in FIG. 1.

○: no line defect
Δ: unobvious line defect(s)
X: obvious line defect(s)

6. Cloud Defect

The pre-baked film aforementioned was observed with bare eyes under the sodium lamp. The cloud defect is shown in FIG. 1.

○: no cloud defect
Δ: unobvious cloud defect
X: obvious cloud defect

7. Poor Coating

The pre-baked film aforementioned was observed with bare eyes under a white lamp. The poor coating is shown in FIG. 2-1 and FIG. 2-2.

Figures 1, 2:
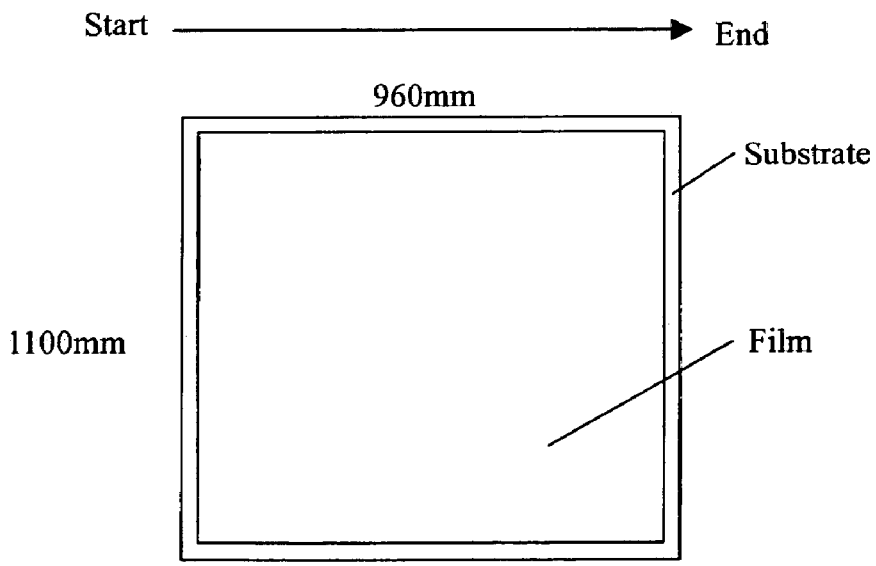
Figure 2:
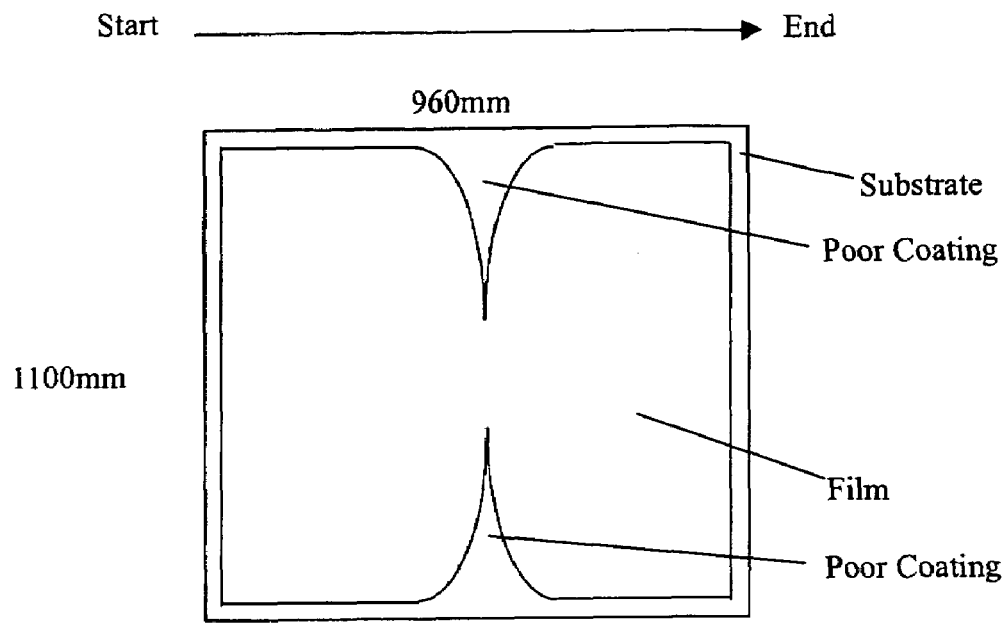

○: no poor coating (FIG. 2-1)
X: obvious poor coating (FIG. 2-2. The area of poor coating is not covered by any photosensitive resin composition.)

8. Inner Uniformaty of the Coated Film

Figure 3:
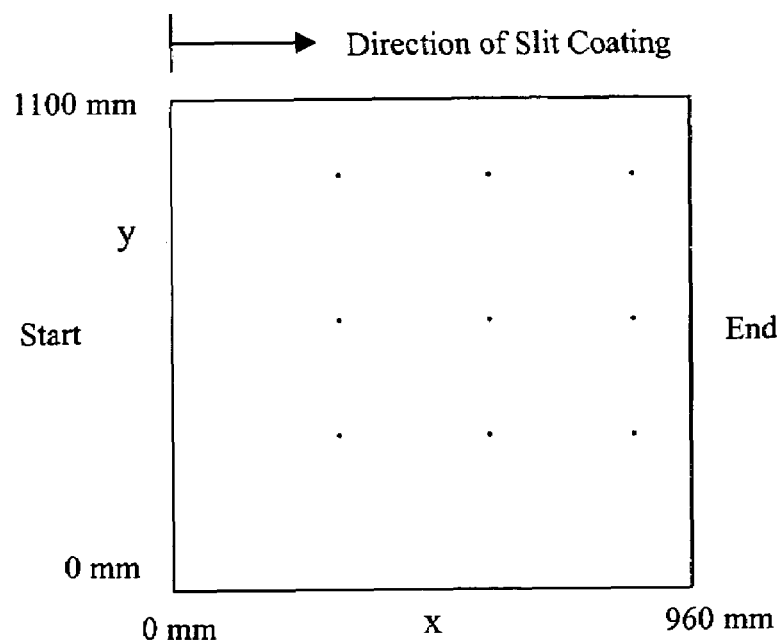
FIG. 3 shows the pre-backed film was measured and positioned with Tencor α-step probe to determine thickness of the film.

The pre-baked film aforementioned was measured with Tencor α-step probe to determine thickness of the film. Positions for measuring are shown in FIG. 3.

$FT_{(avg)}$ is an average thickness of nine thicknesses obtained on the following positions: (x,y)=(240,275), (480,275), (720,275), (240,550), (480,550), (720,550), (240,825), (480,825), (720,825).

$FT(x,y)_{max}$ is the maximum of the nine thicknesses.
$FT(x,y)_{min}$ is the minimum of the nine thicknesses.

The inner uniformity of the coated film can be determined according to the following equation:

$$\frac{FT(x, y)_{max} - FT(x, y)_{min}}{2 \times FT_{(avg)}} \times 100\%$$

○: below 3%
Δ: between 3% and 5%
X: above 5%

9. Photosensitivity

A transmission step wedge (T2115, manufactured by Stouffer Industries, 21 steps in optical density increments) was attached on the prebaked film aforementioned, and then exposed with a high-pressure mercury lamp of 20 W in 800 mJ/cm². After developed in a developer solution at 23° C. for 2 minutes, the film was washed with pure water. The photosensitivity was inspected according to the table of measurements, and higher steps indicated higher photosensitivities.

○: step 9-21
Δ: step 7-8
X: step 1-6

10. Heat Resistance

The pre-baked film aforementioned was iradiated with UV (manufactured by Canon Inc., PLA-501F) in 200 mJ/cm². After developed in a developer solution at 23° C. for 2 minutes, the film was washed with pure water. Then, the film was post-baked at 250° C. for 60 minutes to form a resin film on the large-sized substrate. The Tencor's α-step profilometer was used to measure the thicknesses of the film before and after post-bake. The heat resistance could be determined in accordance with the following equation:

$$\left|\frac{T(b)-T(a)}{T(a)}\right| \times 100 \text{ wt \%}$$

T(a): film thickness before post-bake
T(b): film thickness after post-bake
○: bellow 2 wt %
Δ: between 2 wt % and 4 wt %
X: above 4 wt %

Table 2 shows results of the above evaluation.

While the present invention is illustrated with the preferred embodiments aforementioned, scope of the invention is not thus limited and should be determined in accordance with the appended claims.

TABLE 1

| Component | | Example 1 | Example 2 | Example 3 | Example 4 | Example 5 | Example 6 | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|---|---|---|---|---|
| alkali-soluble resin (A) (parts by weight) | a | 100 | | 100 | | 100 | 50 | | | 100 | 100 | 100 | 100 | | 100 |
| | b | | 100 | | 100 | | 50 | | | | | | | 100 | |
| | c | | | | | | | 100 | 100 | | | | | | |
| photo-polymerizable monomer (B) (parts by weight) | B-1 | 60 | 60 | 50 | 50 | 50 | 50 | 60 | 60 | 50 | 50 | 50 | 50 | 50 | 35 |
| | B-2 | | 10 | 10 | 10 | 10 | 10 | | | 10 | 10 | 10 | 10 | 10 | |
| Photo initiator (C) (parts by weight) | C-1 | 20 | 20 | 20 | 20 | 20 | 20 | 20 | 20 | 20 | 20 | 20 | 20 | 20 | 15 |
| | C-2 | 5 | 6 | 5 | 5 | 5 | | 5 | 5 | 5 | 5 | 5 | 5 | 5 | |
| | C-3 | | | | | 2 | | | | | | | | | |
| Solvent (D) (parts by weight) | D-1 | 3000 | 2200 | 2500 | | 3000 | 3500 | 1200 | 3000 | 1000 | 7000 | | | 1860 | 1150 |
| | D-2 | | | | 3000 | | | | | | | | | | |
| | D-3 | | | 500 | | | | | | | | | | | |
| | D-4 | | | | | | | | | | | 3000 | | | |
| | D-5 | | | | | | | | | | | | 3000 | | |
| Pigment (E) (parts by weight) | E-1 | 150 | 150 | 150 | 150 | 150 | 120 | 150 | 150 | 150 | 150 | 150 | 150 | 150 | 160 |
| Additive (parts by weight) | adhesion agent | 1 | 1 | | 1 | 1 | 1 | | | 1 | | 1 | 1 | 1 | |
| | cross-linking agent | 15 | | 15 | 15 | 15 | 15 | | | | 15 | 15 | 15 | | |
| | diluent | 100 | 100 | 100 | 100 | 100 | | | | | | | | 100 | |
| viscosity of the photosensitive resin composition (cps) | | 1.5 | 2.4 | 1.6 | 1.6 | 1.6 | 1.0 | 4.6 | 2.4 | 4.5 | 0.4 | 1.5 | 1.6 | 3.1 | 3.6 |
| Solid content of the photosensitive resin composition (wt %) | | 13.3 | 17.5 | 13.2 | 13.6 | 13.4 | 9.1 | 22.2 | 10.5 | 25.7 | 4.8 | 10.8 | 10.9 | 19.1 | 21.0 |
| Saturated vapor pressure of the solvent (D) (mm-Hg) | | 3.6 | 3.6 | 3.3 | 0.7 | 3.6 | 3.6 | 3.6 | 3.6 | 3.6 | 3.6 | 8.7 | 15.0 | 0.7 | 3.6 |

B-1 dipentaerythritol hexaacrylate
B-2 dipentaerythritol tetraacrylate
C-1 Ethanone,1-[9-ehtyl-6-(2-methylbenzoyl)-9H-carbazol-3-yl]-,1-(o-acetyloxime)

TABLE 1-continued

| | Example | | | | | | Comparative Example | | | | | | | |
|---|---|---|---|---|---|---|---|---|---|---|---|---|---|---|
| Component | 1 | 2 | 3 | 4 | 5 | 6 | 1 | 2 | 3 | 4 | 5 | 6 | 7 | 8 |

C-2 2-methyl-1-(4-methylthio phenyl)-2-morpholino propane-1-on
C-3 2-benzyl-2-N,N-dimethylamino-1-(4-morpholinophenyl)-1-butanone
D-1 propylene glycol monomethyl ether acetate
D-2 Ethyl 3-ethoxypropionate
D-3 diethylene glycol dimethyl ether
D-4 n-butyl acetate
D-5 methyl isobutyl ketone
E-1 pigment C.I.7
adhesion agent 3-methacryloxypropyltrimethoxysilane
cross-linking agent 1031S (manufactured by Japan Epoxy Resins Co., Ltd.)
diluent RE801 (manufactured by Teikoku Printing Inks Mfg.)

TABLE 2

| Item of Evaluation | Example | | | | | | Comparative Example | | | | | | | |
|---|---|---|---|---|---|---|---|---|---|---|---|---|---|---|
| | 1 | 2 | 3 | 4 | 5 | 6 | 1 | 2 | 3 | 4 | 5 | 6 | 7 | 8 |
| Line defect | ○ | ○ | ○ | ○ | ○ | ○ | X | Δ | X | ○ | ○ | ○ | Δ | X |
| Cloud defect | ○ | ○ | ○ | ○ | ○ | ○ | Δ | Δ | Δ | X | ○ | ○ | Δ | Δ |
| Inner Uniformity | ○ | ○ | ○ | ○ | ○ | ○ | X | Δ | X | X | X | X | X | X |
| Pinhole | ○ | ○ | ○ | ○ | ○ | ○ | ○ | ○ | ○ | ○ | X | X | ○ | ○ |
| Poor Coating | ○ | ○ | ○ | ○ | ○ | ○ | X | ○ | X | ○ | ○ | ○ | X | X |
| Photosensitivity | ○ | ○ | ○ | ○ | ○ | ○ | X | X | ○ | ○ | ○ | ○ | ○ | ○ |
| Heat resistance | ○ | ○ | ○ | ○ | ○ | ○ | X | X | ○ | ○ | ○ | ○ | ○ | ○ |

What is claimed is:

1. A photosensitive resin composition for a black matrix comprising:
    (A) an alkali-soluble resin;
    (B) a photopolymerizable monomer;
    (C) a photoinitiator;
    (D) a solvent; and
    (E) a black pigment;
    wherein said alkali-soluble resin (A) comprises a functional group having a general formula (a-1)

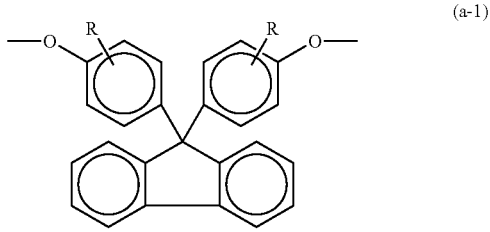

(a-1)

wherein each of R is independently H, linear or branch alkyl of C1-C5, phenyl or halogen;
    wherein the viscosity of said photosensitive resin composition for the black matrix is 0.5-4.0 cps at 25° C. and the solid content of said photosensitive resin composition is 5-17.5 wt %;
    wherein said solvent (D) has a saturated vapor pressure below 4.5 mmHg at 20° C.;
    wherein the amount of pigment (E) is 60-300 parts by weight, based on 100 parts by weight of the alkali-soluble resin (A).

2. The composition of claim 1 wherein the viscosity of said photosensitive resin composition for the black matrix is 0.7-3.5 cps at 25° C.

3. The composition of claim 1 wherein the viscosity of said photosensitive resin composition for the black matrix is 0.9-3.0 cps at 25° C.

4. The composition of claim 1 wherein said photosensitive is coatable on an LCD substrate by slit coating.

* * * * *